United States Patent [19]

Tanaka et al.

[11] Patent Number: 4,935,792
[45] Date of Patent: Jun. 19, 1990

[54] THIN FILM TRANSISTOR ARRAY

[75] Inventors: Hirohisa Tanaka, Gose; Kohei Kishi, Nara; Hiroaki Kato, Nara; Mitsuhiro Koden, Nara, all of Japan

[73] Assignee: Sharp Kabushiki Kaisha, Osaka, Japan

[21] Appl. No.: 267,680

[22] Filed: Nov. 1, 1988

Related U.S. Application Data

[63] Continuation of Ser. No. 933,489, Nov. 21, 1986, abandoned.

[30] Foreign Application Priority Data

Nov. 27, 1985 [JP] Japan ............................... 60-270355
Mar. 27, 1986 [JP] Japan ............................... 61-70224

[51] Int. Cl.⁵ ...................... H01L 29/78; H01L 27/12
[52] U.S. Cl. ...................................... 357/23.7; 357/4; 357/45
[58] Field of Search ............................ 357/23.7, 4, 45

[56] References Cited

U.S. PATENT DOCUMENTS

| 4,065,781 | 12/1977 | Gutknecht | 357/23.7 |
| 4,332,075 | 1/1982 | Ota | 357/4 |
| 4,425,572 | 1/1984 | Takafuji et al. | 357/7 |
| 4,646,424 | 3/1987 | Parks et al. | 357/23.7 |
| 4,651,185 | 3/1987 | Holmberg et al. | 357/4 |
| 4,804,953 | 2/1989 | Castleberry | 357/23.7 |

FOREIGN PATENT DOCUMENTS

| 0125666 | 11/1984 | European Pat. Off. | 357/23.7 |
| 54-154289 | 12/1979 | Japan | 357/23.7 |

Primary Examiner—Jerome Jackson, Jr.

[57] ABSTRACT

A thin film transistor array in which a plurality of thin film transistors arranged in the shape of an array on a substrate each transistor includes a gate electrode, a first insulating layer, a semiconducting layer, a second insulating layer, a source electrode and a drain electrode stacked sequentially one on another such that the first insulating layer and the second insulating layer are interposed at an overlap portion between a gate bus bar for connecting the gate electrodes in common and a source bus bar for connecting the source electrodes in common.

6 Claims, 8 Drawing Sheets

THIN FILM TRANSISTOR ARRAY

This application is a continuation of application Ser. No. 933,489, filed on Nov. 21, 1986, now abandoned.

BACKGROUND OF THE INVENTION

The present invention generally relates to transistors and more particularly, to a thin film transistor (referred to as "TFT", hereinbelow) array which has a structure leading to an improvement of yield of its manufacture.

Recently, in active matrix display of liquid crystal, an extensive study has been conducted on an active matrix substrate in which TFTs are formed in a shape of a matrix on an insulating substrate. Semiconducting materials used for the TFTs include poly-Si, a(amorphous)-Si, Te, CdSe, etc.

Figure 1:
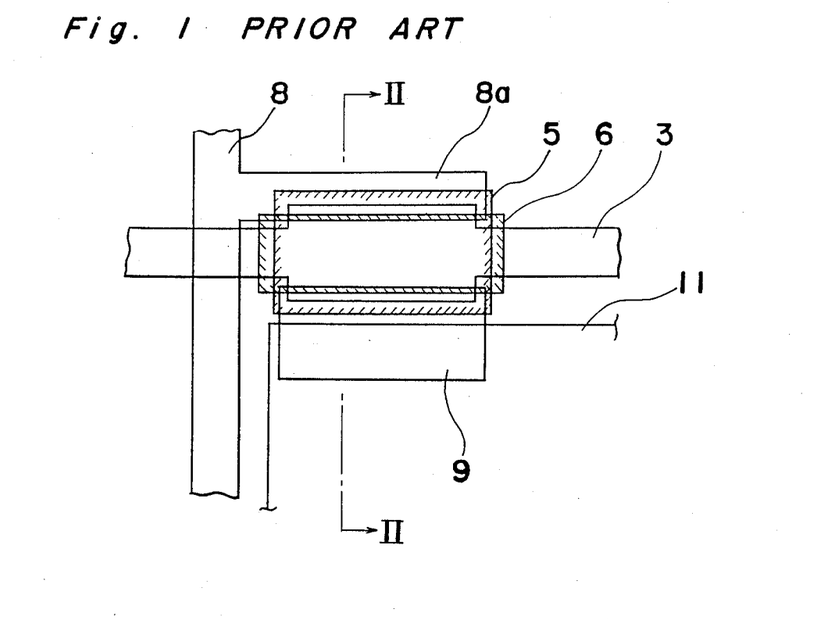
FIG. 1 is a fragmentary top plan view of a prior art TFT array (already referred to)
Figure 2:
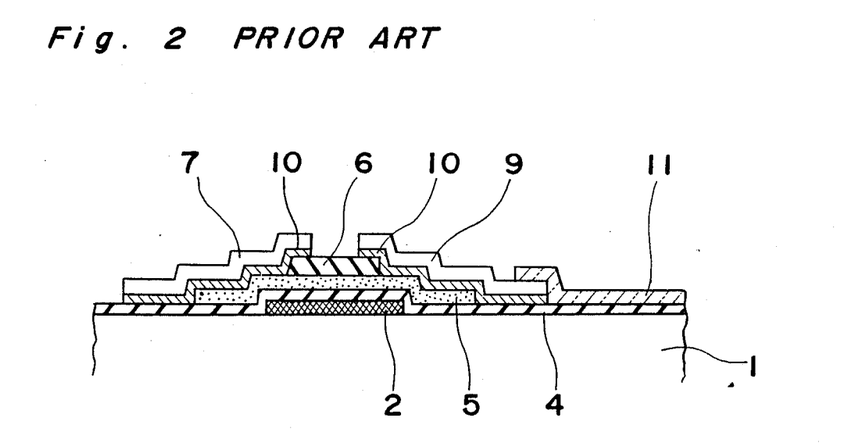
FIG. 2 is a sectional view taken along the line II—II in FIG. 1 (already referred to)

A structure of a known TFT utilizes a-Si is described with reference to FIGS. 1 and 2. The known TFT includes a glass substrate 1 and a gate bus bar 3 for connecting gate electrodes 2 on the glass substrate 1. The gate bus bar 3 has a film thickness of 1,000 to 4,000 Å and is made of such metals as Ta, Mo, Ti, Al, etc. A gate insulating film 4, which is stacked on the glass substrate 1 and the gate electrode 2, has a film having a film thickness of 1,000 to 3,000 Å and is made of silicon nitride (referred to as "SiNx", hereinbelow) by using a plasma CVD (chemical vapor deposition) method. In FIG. 1, the gate insulating film 4 is not shown. An a-Si layer 5 acting as a semiconducting layer for the TFT, which is stacked on the gate insulating film 4, is formed into a film thickness of 100 to 3,000 Å, by using the plasma CVD method. A second insulating film 6, which is formed by SiNx film having a thickness of 1,000 to 5,000 Å, is formed on the a-Si layer 5 by using the plasma CVD method. Source electrodes 7 and a source bus bar 8 for connecting the source electrodes 7 are formed at right angles to the gate bus bar 3. The source bus bar 8 has a plurality of branch portions 8a arranged at predetermined intervals. Each of the TFTs is so formed as to be disposed, at its center, at each of the branch portions 8a. The source electrode 7 and a drain electrode 9 each have a film thickness of 2,000 to 10,000 Å and are made of such metals as Mo, Ti, Al, etc.

Meanwhile, it is desirable that an a-Si film 10 having a thickness of 100 to 1,000 Å, in which phosphorus is doped, is disposed between the drain electrode 9 and the a-Si layer 5 because ohmic contact between the source electrode 7 and the a-Si layer 5 and between the drain electrode 9 and the a-Si layer 5 is effected. Thus, the TFTs are formed in a shape of an array at points of intersections between the gate bus bars 3 and the source bus bars 8. Furthermore, a picture element electrode 11, which is formed by a transparent and electrically conductive film made of, for example, indium oxide, is formed in contact with the drain electrode 9.

In the known active matrix substrate employing the TFT array, each point of intersection of the matrix is driven by a linear sequential method. Namely, a scanning signal is inputted from one gate bus bar to be scanned and a data signal is inputted from each source bus bar. A number of points of intersection are formed between the gate bus bars and the source bus bars. For example, in a matrix of 250×250, 62,500 points of intersection exist between the gate bus bars and the source bus bars. If a leakage occurs between a gate and a source even at one of the many points of intersection between the gate bus bars and the source bus bars, a cruciform line defect is necessarily produced between the corresponding gate bus bar and the corresponding source bus bar at the time of display, so that the display cannot be put to practical use. Thus, the yield of the active matrix substrate becomes zero. Therefore, as the number of gate bus bars and source bus bars increases, insulation between the gates and the sources is required to be performed with greater effect to reduce the likelihood of leakage.

As a result of investigation of the portions of leakage between the gates and the sources by using various methods, the present inventors have found that leakage takes place especially frequently at an intersectional portions (interrupted hatched portion in FIG. 1) between an edge of the gate and the source. It is considered that since the film thickness of the gate insulating film is larger than or substantially equal to that of the gate electrode, the gate bus bar has, at its edge portion, a smaller film thickness so as to have a smaller dielectric strength. Also because a stepped portion of the gate insulating film is inferior, in insulating property, to a flat portion of a the gate insulating film due to difference in the film properties between the flat portion and the stepped portion that causes this leakage.

Figure 3:
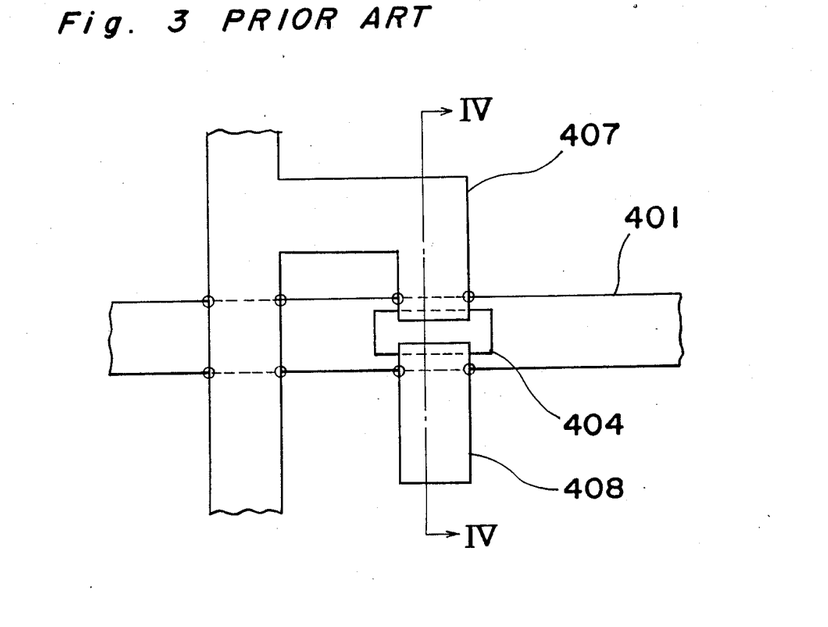
FIG. 3 is a fragmentary top plan view of another prior art TFT (already referred to)
Figure 4:
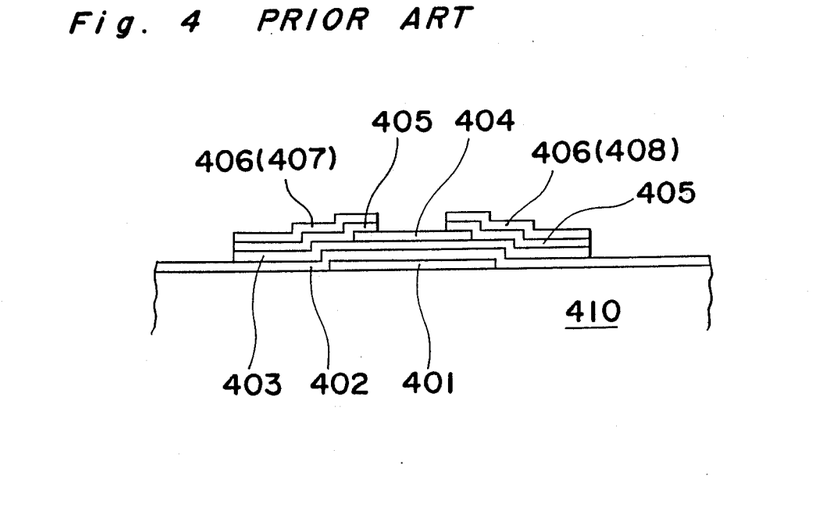
FIG. 4 is a sectional view taken along the line IV—IV in FIG. 3 (already referred to)

A structure of another prior art field effect type TFT utilizes a-Si is described with reference to FIGS. 3 and 4. The prior art TFT includes an insulating substrate 410 made of glass or the like and a gate electrode 401 having a thickness of 1,000 to 4,000 Å. Furthermore, by using the plasma CVD method, a gate insulating film having a thickness of 1,000 to 3,000 Å, an a-Si film 403 having a thickness of 100 to 3,000 Å and a protective insulating film 404 having a thickness of 1,000 to 5,000 Å are continuously stacked one upon another in a vacuum. Subsequently, after the protective insulating film 404 has been subjected to patterning, an $n^+$-a-Si film 405 having a thickness of 100 to 1,000 Å, that is phosphorus doped, and a source/drain metallic film 406 are stacked. By patterning the source/drain metallic film 406, the source/drain metallic film 406 is formed into a source electrode 407 and a drain electrode 408. It is to be noted that the protective insulating film 404 is provided for protecting the a-Si film 403 from etchant at the time of patterning of the $n^+$-a-Si film 405. Moreover, although not specifically shown, a picture element electrode is formed in contact with the drain electrode 408. Thus, the TFTs and the picture elements are formed in a shape of an array at points of intersection between the gate electrodes 401 and the source electrodes 407.

However, in the prior art TFT referred to above, such a problem arises in that the gate insulating film 402 having a thickness of 1,000 to 3,000 Å, which is made of $SiO_2$, SiNx, etc., is readily damaged by hydrofluoric acid in processes for etching the $n^+$-a-Si film or the a-Si film, the source/drain electrode, etc. by using etchant including hydrofluoric acid, with no doping being performed in the a-Si film, the source/drain electrode, etc. Especially, at an edge portion of the gate electrode 401, the gate insulating film 402 not only has a smaller film thickness but is likely to be damaged by hydrofluoric acid due to its film properties. Hence, at encircled portions in FIG. 3, i.e., at intersectional portions between the edge portion of the gate electrode and the edge portion of the source/drain electrode, the gate insulating film 402 is damaged by hydrofluoric acid, so that a dielectric strength of the gate insulating film 402 drops and thus, undesirable leakage between the gate and the source is likely to take place.

SUMMARY OF THE INVENTION

Accordingly, an essential object of the present invention is to provide a TFT array having a structure leading to improvement of yield of its manufacture, therefore, a second insulating film is provided at the overlap portions between source bus bars and gate bus bars in an array of TFTs each formed by a gate electrode, a gate insulating film, a semiconducting film, the second insulating film, a source electrode and a drain electrode stacked sequentially on an insulating substrate.

By this arrangement of the TFT array of the present invention, insulation of an intersectional portion between the gate bus bar and the source bus bar is performed more positively and the yield of the TFT array is improved through the prevention of leakage between the gate and the source. Therefore, a liquid crystal display unit employing the TFT array substrate can be manufactured easily and reliably.

BRIEF DESCRIPTION OF THE DRAWINGS

This object and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE PREFERRED EMBODIMENTS

Figure 5:
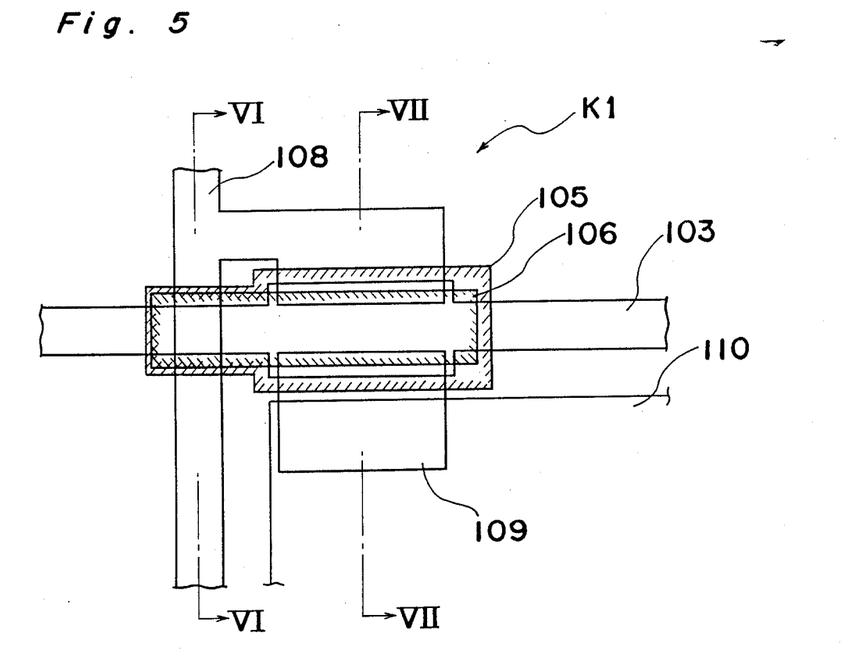
FIG. 5 is a fragmentary top plan view of a TFT array according to a first embodiment of the present invention.
Figure 6:
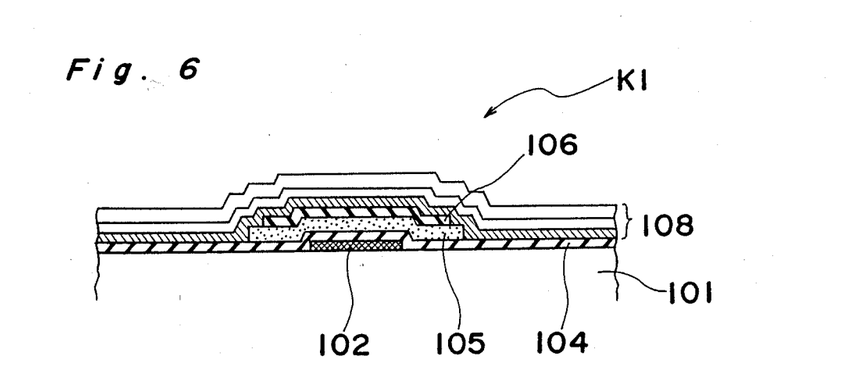
FIG. 6 is a sectional view taken along the line VI—VI in FIG. 5.

Referring now to the drawings, there is shown in FIGS. 5 and 6, a TFT array K1 according to a first embodiment of the present invention. The TFT array K1 is formed on a support substrate such as a glass substrate 101, etc. and includes a gate electrode 102, a gate bus bar 103, a gate insulating film 104, an a-Si layer 105 acting as a semiconducting layer of the TFT, a second insulating layer 106 made of SiNx, a source electrode 107, a source bus bar 108, a drain electrode 109 and a picture element electrode 110. FIG. 6 shows an intersectional portion between the gate bus bar 103 and the source bus bar 108. The TFT array is arranged in correspondence to points of intersection between the gate bus bars 103 and the source bus bars 108. In this embodiment, after the second insulating layer 106 has been stacked on the a-Si layer 105, one edge portion of the second insulating layer 106 is extended along the gate bus bar 103 so as to be disposed above the source bus bar 108 such that the second insulating layer 106 is interposed at an intersectional portion between the gate bus bar 103 and the source bus bar 108, whereby leakage between the gate and the source is drastically reduced. The source electrode 107 is connected to a branch portion of the source bus bar 108, while the picture element electrode 110 is connected to the drain electrode 109. Meanwhile, if the a-Si layer 105 is also interposed at the intersectional portion between the gate bus bar 103 and the source bus bar 108, leakage between the gate and the source can be reduced further.

Figure 7A:
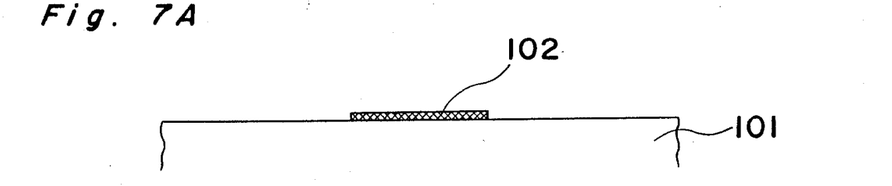
FIGS. 7A to 7D are views for explaining the processes for manufacturing the TFT array of FIG. 5.
Figure 7B:
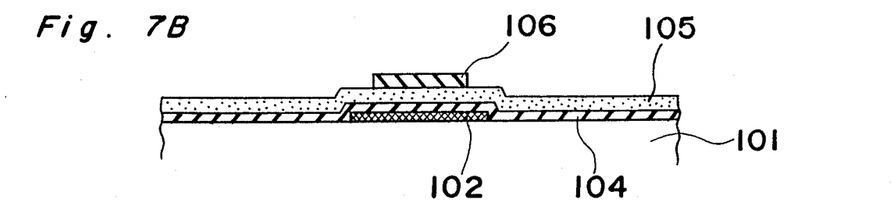
Figure 7C:
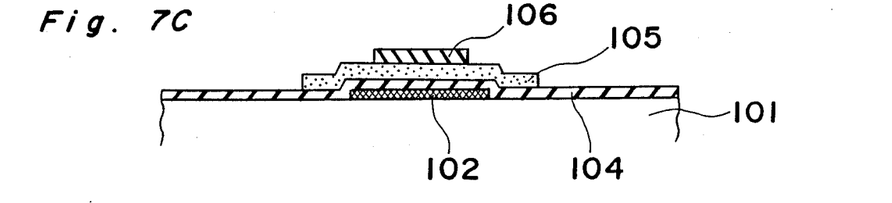
Figure 7D:
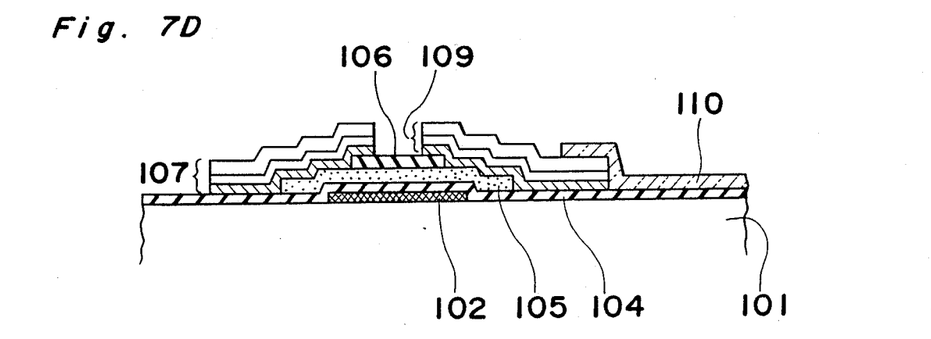

The TFT array K1 having the structure shown in FIG. 5 is manufactured, for example, as shown in FIGS. 7A to 7D. FIGS. 7A to 7D illustrate manufacturing processes of the TFT array K1 and are sectional views taken along the line VII—VII in FIG. 5. Initially, a Ta (tantalum) layer having a thickness of 2,000 Å is bonded to a whole surface of the glass substrate 101 by sputtering and is patterned into a shape of the gate bus bar 103 as shown in FIG. 5 by etching so as to form the gate electrode 102 as shown in FIG. 7A. As will be described later, the semiconducting layer is stacked on the gate electrode 102 such that an operating portion of the TFT is formed. Subsequently, as shown in FIG. 7B, by using the plasma CVD method, an SiNx film of 3,000 Å in thickness acting as the gate insulating film 104, the a-Si layer 105 of 1,500 Å in thickness acting as the semiconducting layer and an SiNx film of 2,000 Å in thickness acting as the second insulating film 106 are sequentially and wholly bonded to one another continuously. Then, the upper SiNx film is patterned into a shape of the second insulating film 106 shown in FIG. 5. Namely, the second insulating film 106 is extended along the gate bus bar 103 up to a point immediately above the gate bus bar 103 and the source bus bar 108. Thereafter, as shown in FIG. 7C, the a-Si layer 105 is also patterned into a shape of the a-Si layer 105 shown in FIG. 5 by etching. This a-Si layer 105 is also extended up to the intersectional portion between the gate bus bar 103 and the source bus bar 108 in the same manner as the above described second insulating film 106. Then, as shown in FIG. 7D, an a-Si layer in which phosphorus is doped by using the plasma CVD method, a Ti (titanium) layer and an Mo (molybdenum) layer are sequentially and continuously stacked into three layers having thicknesses of 1,000 Å, 1,000 Å and 2,000 Å, respectively, with the Ti layer and the Mo layer being formed by sputtering. The three layers thus obtained are patterned into shapes of the source bus bar 108 and the drain electrode 109 shown in FIG. 5 so as to form the source electrode 107 and the drain electrode 109 each having a three-layer structure of the a-Si layer, the Ti layer and the Mo layer and thus, the TFT is formed. Finally, an indium oxide layer of 3,000 Å in thickness is stacked and then, is patterned, by etching, into the picture element electrode 110.

The TFTs produced by the above described manufacturing processes are arranged at points of intersection between the gate bus bars 103 and the source bus bars 108 in the shape of a matrix on the glass substrate 101 so as to for the TFT array. By inputting a scanning signal and a data signal to the gate bus bar 103 and the source bus bar 108, respectively, the TFTs are subjected to matrix drive. Namely, the scanning signal of the gate bus bar 103 is applied, as a gate voltage, to the TFTs for each line from the gate electrode 102. Meanwhile, the data signal of the source bus bar 108 is applied, as a data voltage, to the TFTs for each line through the branch portion from the source electrode 107 having the three-layer structure. This data voltage is subjected, through the a-Si layer 105, to synchronous control by the scanning signal so as to be applied to the picture element electrode 110 from the drain electrode 109 having the three-layer structure. The a-Si layer of the source electrode 107 and the a-Si layer of the drain electrode 109 establish ohmic contact with the a-Si layer 105 acting as the semiconducting layer of the TFT. Meanwhile, the Ti layer of the source electrode 107 and the Ti layer of the drain electrode 109 contribute to the improvement of the adhesive property and mechanical strength of the source electrode 107 and the drain electrode 109.

Figure 8:
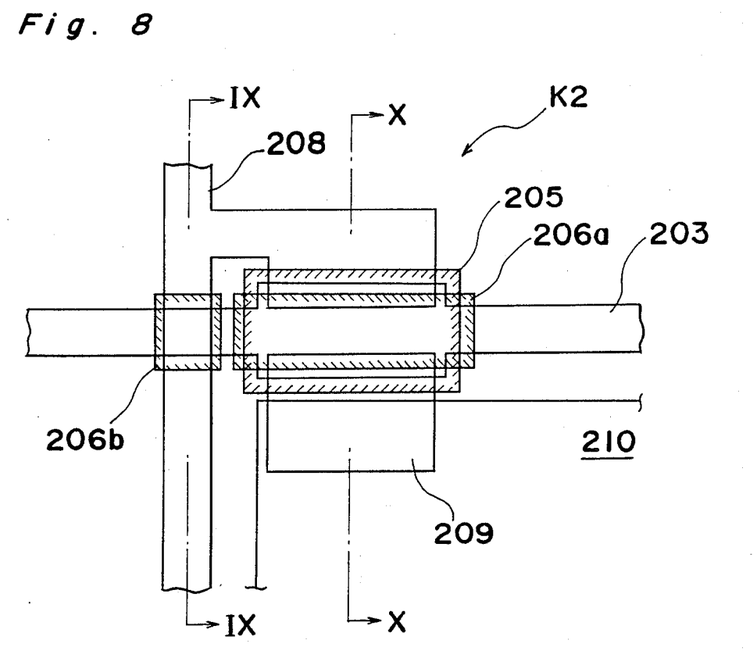
FIG. 8 is a view similar to FIG. 5, particularly showing a second embodiment of the present invention.
Figure 9:
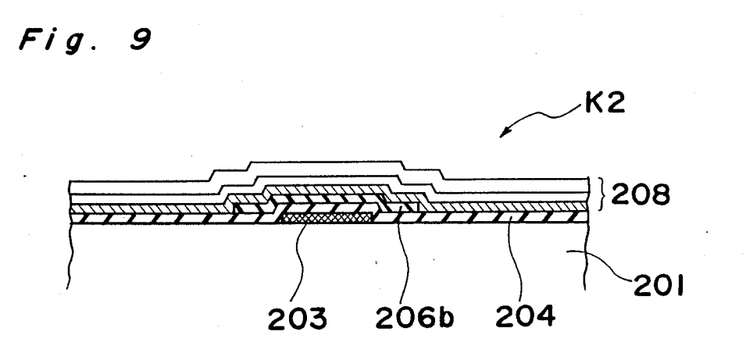
FIG. 9 is a sectional view taken along the line IX—IX in FIG. 8.

Referring to FIGS. 8 and 9, there is shown a TFT array K2 according to a second embodiment of the present invention. In the same manner as the TFT array K1, the TFT array K2 includes a gate electrode 202, a gate bus bar 203, a gate insulating film 204, an a-Si layer 205, a second insulating layer 206, a source electrode 207, a source bus bar 208, a drain electrode 209 and a picture element electrode 210, that are formed on a glass substrate 201. In this embodiment, at the time of patterning of the second insulating layer 206, the second insulating layer 206 is divided into two portions, i.e. an insulating layer 206a disposed at the TFT and an insulating layer 206b disposed on the source bus bar 208. Namely, the insulating layer 206b is provided at an intersectional portion between the gate bus bar 203 and the source bus bar 208. The second insulating layer 206 is made of $SiO_2$ (silicon dioxide) so as to remarkably reduce leakage between the gate and the source.

Figure 10A:
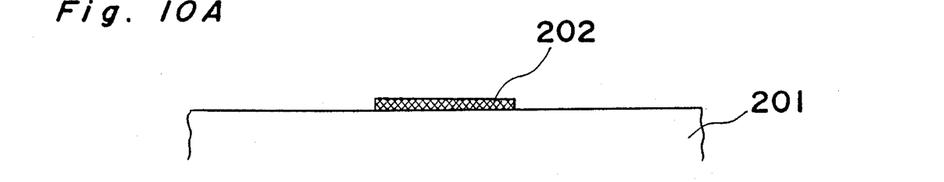
FIGS. 10A to 10D are views explaining the processes for manufacturing TFT array of FIG. 8.
Figure 10B:
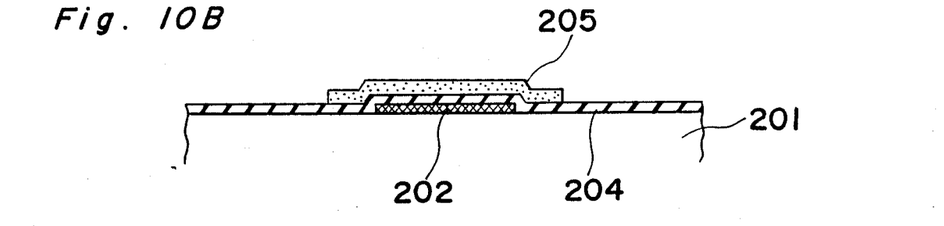
Figure 10C:
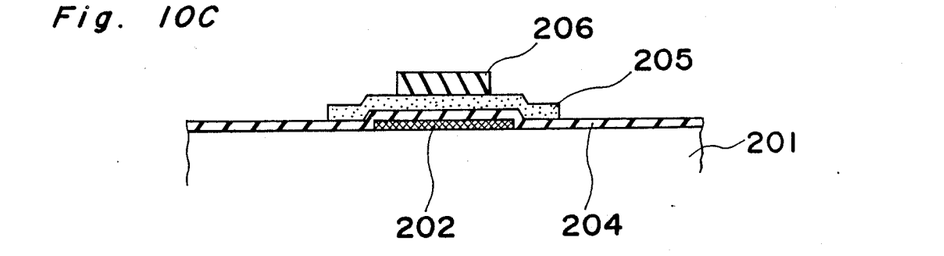
Figure 10D:
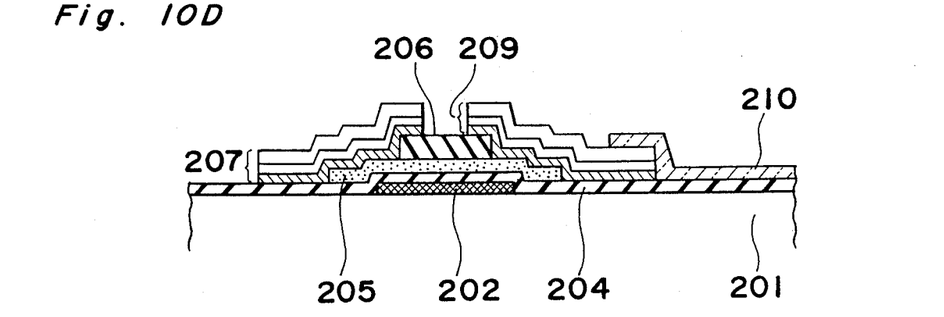

The TFT array K2 having the structure shown in FIG. 8 is manufactured as shown in FIGS. 10A to 10D. Figs. 10A to 10D illustrate manufacturing processes of the TFT array K2 and are sectional views taken along the line X-X in FIG. 8. Initially, a Mo (molybdenum) layer of 2,000 Å in thickness is bonded to a whole surface of the glass substrate 201 by sputtering and is patterned into a shape of the gate bus bar 203 as shown in FIG. 8 by etching so as to form the gate electrode 202 shown in FIG. 10A. Subsequently by using the plasma CVD method, a $SiN_x$ film of 3,000 Å in thickness, which acts as the gate insulating film 204 and an a-Si layer 205 of 1,500 Å in thickness acting as the semiconducting layer of the TFT, are wholly bonded continuously and the a-Si layer 205 is patterned into a shape of the semiconducting layer shown in FIG. 8. This a-Si layer 205 is formed only at the TFT portion. Furthermore, as shown in FIG. 10C, a $SiO_2$ film of 3,000 Å in thickness acting as the second insulating layer 206, is wholly bonded by the plasma CVD method and then, is patterned, by etching, into the insulating layer 206a that is disposed at the TFT and the insulating layer 206b that is disposed on the source bus bar 208. Then, as shown in FIG. 10D, an a-Si layer of 1,000 Å in thickness, in which phosphorus is doped by the plasma CVD method, and an Al (aluminum) layer of 2,000 Å in thickness are continuously bonded and then, are patterned into shapes of the source bus bar 208 and the drain electrode 209 shown in FIG. 8 so as to form the source electrode 207 and the drain electrode 209. Finally, an indium oxide film of 3,000 Å in thickness is formed by sputtering and then, is patterned by etching such that one edge portion of the picture element electrode 210 overlaps the drain electrode 209, whereby the TFT array K2 is obtained. In the TFT array K1 of the first embodiment, both the second insulating layer 106 and the a-Si layer 105 are extended so as to be interposed between the source bus bar 108 and the gate bus bar 103. However, in this embodiment, only the second insulating layer 206 is extended so as to be interposed between the source bus bar 208 and the gate bus bar 203.

Figure 11:
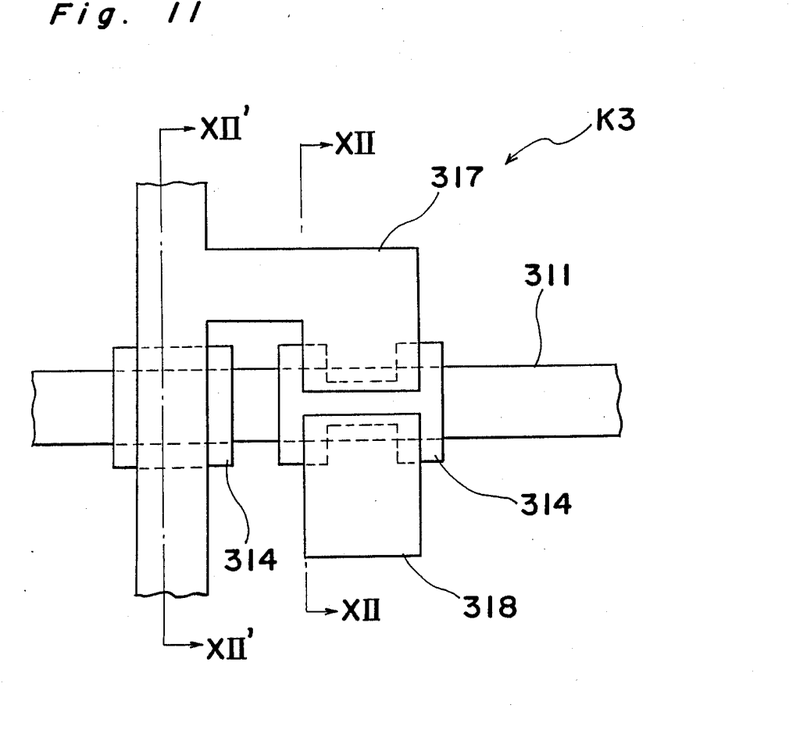
FIG. 11 is a fragmentary top plan view of a TFT array according to a third embodiment of the present invention.
Figure 12A:
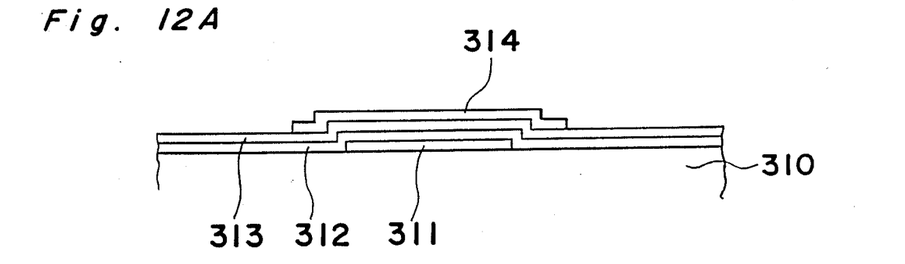
FIGS. 12A to 12C are sectional views taken along the line XII—XII in FIG. 11.
Figure 12B:
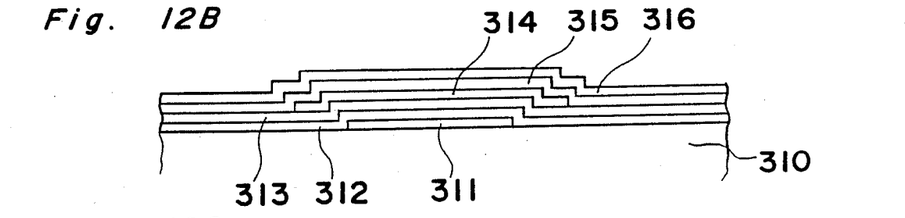
Figure 12C:
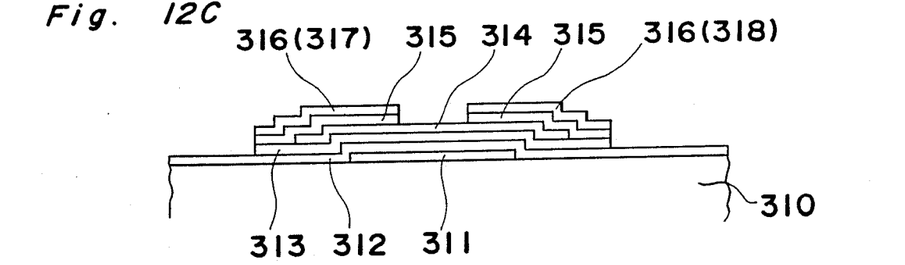
Figure 12D:
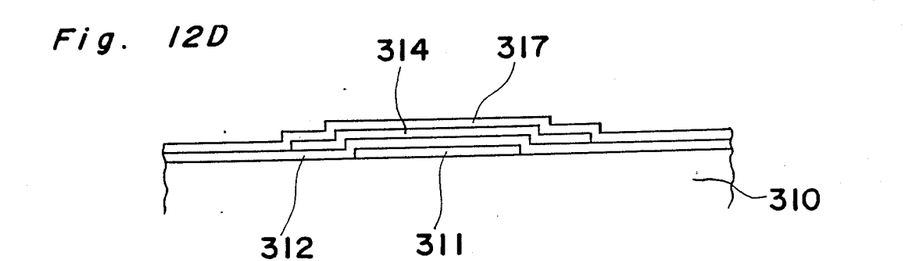
FIG. 12D is a sectional view taken along the line XII'—XII' in FIG. 11.

Referring to FIGS. 11 and 12, a TFT array K3 is shown according to a third embodiment of the present invention. In the TFT array K3, initially as shown in FIG. 12A, a gate electrode 311 of 1,000 to 4,000 Å in thickness is formed on an insulating film 310 as shown in FIG. 12A. Then, a gate insulating film 312 of 1,000 to 4,000 Å in thickness, an a-Si film 313 of 100 to 2,000 Å in thickness and a protective insulating film 314 of 1,000 to 5,000 Å in thickness are continuously stacked one on another in a vacuum. Subsequently, the protective insulating film 314 is patterned by etching. At this time, the protective insulating film 314 is patterned so as to protect intersectional portions between one edge portion of the gate electrode 311 and edge portions of a source electrode 317 and intersectional portions between the other edge portion of the gate electrode 311 and edge portions of a drain electrode 318. Then, as shown in FIG. 12B, an $n^+$-a-Si film 315 of 100 to 1,000 Å in thickness, in which phosphorus is doped, and a source/drain metallic layer 316 is stacked. Thereafter, as shown in FIG. 12C, the $n^+$-a-Si film 315 and the source/drain metallic layer 316 is patterned so as to form the source electrode 317 and the drain electrode 318. In the TFT array K3, since at the encircled portions in Fig. 3, namely at the intersectional portions between one edge portion of the gate electrode 311 and the edge portions of the source electrode 317 and between the other edge portion of the gate electrode 311 and the edge portions of the drain electrode 318, the gate insulating layer 312 are protected by the protective insulating film 314, the an undesirable phenomenon whereby the gate insulating film is damaged by an etchant such as hydrofluoric acid does not occur. Therefore leakage between the gate and the source and between the gate and the drain is reduced.

Although the present invention has been fully described by way of example with reference to the accompanying drawings, it is to be noted here that various changes and modifications will be apparent to those skilled in the art. Therefore, unless such changes and modifications otherwise depart from the scope of the present invention, they should be construed as being included therein.

What is claimed is:
1. A thin film transistor array comprising:
   a substrate;
   a plurality of thin film transistors arranged in a shape of an array on said substrate, said thin film transistors each including, a gate electrode formed on said substrate, a first insulating layer formed over said gate electrode and said substrate, a semiconducting layer formed on a first portion of said first insulating layer, a second insulating layer formed on a second portion of said semiconducting layer wherein the area of said second portion is smaller than the area of said first portion, and a source/drain layer formed over each of the previously formed said layers and forming a source electrode and a drain electrode for each transistor;

a gate bus bar for commonly connecting at least some of said gate electrodes; and a source bus bar for commonly connecting at least some of said source electrodes;

said source bus bar and said gate bus bar intersecting at an intersectional overlay area of said array associated with a said thin film transistor;

said first insulating layer, said semiconducting layer and said second insulating layer of each said transistor extending across said substrate and into said intersectional overlay area so as to prevent leakage between said gate bus bar and said source bus bar at said intersectional overlay area;

said first and second portions being formed to smooth the transition between the surface of said substrate and the surface of said first insulating layer to reduce the gradient over which said source/drain layer must be applied to reduce possible breakage of said source/drain layer.

2. A thin film transistor array as claimed in claim 1, wherein said semiconducting layer is made of amorphous silicon.

3. A thin film transistor array as claimed in claim 1, wherein said first insulating layer and said second insulating layer are made of silicon nitride.

4. A thin film transistor array as claimed in claim 1, wherein said first insulating layer and said second insulating layer are made of silicon oxide.

5. a thin film transistor array comprising:
a substrate;

a gate electrode bus formed on said substrate for connecting a predetermined number of a plurality of gate electrodes in the thin film transistor array;

a gate insulating film formed over said gate electrode bus;

a semiconducting film formed on a portion of said gate insulating film;

a protective insulating film formed on said semiconducting film; and a source electrode bus for connecting a predetermined number of a plurality of source electrodes in the thin film array that is formed on said gate insulating film, said semiconducting film and said protective insulating film, said source electrode bus and said gate electrode bus intersecting at an intersectional overlay area of the array;

said gate insulating film, said semiconducting film and said protective insulating film being interposed between said gate electrode bus and said source electrode bus at said intersectional;

said gate insulating film having a peripheral edge around at least a substantial portion of said intersectional overlay area;

said semiconductor film having a peripheral edge around said substantial portion of said intersectional overlay area, said peripheral edge of said semiconducting film being inside of said peripheral edge of said gate insulating film to form a first step;

said protective insulating film having a peripheral edge around said substantial portion of said intersectional overlay area, said peripheral edge of said protective insulating film being inside of said peripheral edge of said semiconducting film to form a second step;

said first and second steps smoothing the transition between the surface of said substrate and the surface of said gate insulating film to reduce the gradient over which said source electrode bus must be applied to reduce possible breakage of said source electrode bus.

6. A thin film transistor array as claimed in claim 5, wherein said semiconducting film is made of amorphous silicon.

* * * * *